(12) United States Patent
Oh et al.

(10) Patent No.: US 8,258,004 B2
(45) Date of Patent: Sep. 4, 2012

(54) DISPLAY DEVICE AND MANUFACTURING METHOD THEREOF

(75) Inventors: Joon-hak Oh, Yongin-si (KR); Mun-pyo Hong, Seongnam-si (KR); Bo-sung Kim, Seoul (KR); Yong-uk Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 363 days.

(21) Appl. No.: 12/561,218

(22) Filed: Sep. 16, 2009

(65) Prior Publication Data

US 2010/0006832 A1    Jan. 14, 2010

Related U.S. Application Data

(63) Continuation of application No. 11/601,086, filed on Nov. 17, 2006, now Pat. No. 7,638,358.

(30) Foreign Application Priority Data

Nov. 19, 2005    (KR) .................. 10-2005-0111023

(51) Int. Cl.
*H01L 21/00* (2006.01)

(52) U.S. Cl. .................... 438/99; 438/151; 438/30

(58) Field of Classification Search ............ 438/99, 438/151, 30
See application file for complete search history.

(56) References Cited

U.S. PATENT DOCUMENTS

| | | | |
|---|---|---|---|
| 6,410,947 B1 | 6/2002 | Wada ........................ 257/194 |
| 6,429,053 B1 | 8/2002 | Yamazaki et al. | |
| 6,821,811 B2 | 11/2004 | Hirakata et al. | |
| 6,853,083 B1 | 2/2005 | Yamauchi et al. | |
| 6,885,146 B2 | 4/2005 | Yamazaki et al. | |
| 6,909,477 B1 | 6/2005 | Yi et al. ........................ 349/106 |
| 6,972,261 B2 * | 12/2005 | Wong et al. ................... 438/706 |
| 7,223,700 B2 * | 5/2007 | Wong et al. ................... 438/706 |
| 7,226,819 B2 | 6/2007 | Maekawa et al. ............ 438/149 |
| 7,342,247 B2 * | 3/2008 | Lee et al. ........................ 257/40 |
| 7,518,140 B2 * | 4/2009 | Suh et al. ........................ 257/40 |
| 7,638,358 B2 * | 12/2009 | Oh et al. ........................ 438/99 |
| 7,638,802 B2 * | 12/2009 | Song et al. ..................... 257/59 |

(Continued)

FOREIGN PATENT DOCUMENTS

CN    1511863    7/2004
(Continued)

OTHER PUBLICATIONS

Patent Abstracts of Japan, Publication No. 2003-337353, Nov. 28, 2003, 1 p.

(Continued)

*Primary Examiner* — Laura Menz
(74) *Attorney, Agent, or Firm* — Innovation Counsel LLP

(57) ABSTRACT

According to an embodiment of the present invention, a manufacturing method of a display device includes forming a plurality of gate wires comprising a gate electrode on an insulating substrate, forming an electrode layer comprising a source electrode and a drain electrode spaced apart from each other to define a channel region on the gate electrode interposed therebetween, forming a first barrier wall having a first opening for exposing the channel region, a portion of the source electrode, and a portion of the drain electrode on the electrode layer where the first barrier wall has a surface, forming a shielding film to cover the channel region inside the first opening, treating the surface of the first barrier wall, removing the shielding film, and forming an organic semiconductor layer inside the first opening.

7 Claims, 20 Drawing Sheets

U.S. PATENT DOCUMENTS

| | | | |
|---|---|---|---|
| 7,649,312 B2 * | 1/2010 | Saafir et al. | 313/506 |
| 7,675,059 B2 * | 3/2010 | Kim et al. | 257/40 |
| 7,750,342 B2 * | 7/2010 | Kim et al. | 257/40 |
| 7,781,763 B2 * | 8/2010 | Hahn et al. | 257/40 |
| 7,781,774 B2 * | 8/2010 | Cho et al. | 257/72 |
| 7,800,104 B2 * | 9/2010 | Choi et al. | 257/40 |
| 7,803,669 B2 * | 9/2010 | Cho et al. | 438/148 |
| 7,842,538 B2 * | 11/2010 | Lee et al. | 438/99 |
| 7,842,944 B2 * | 11/2010 | Choi et al. | 257/40 |
| 7,855,121 B2 * | 12/2010 | Kim et al. | 438/384 |
| 7,875,475 B2 * | 1/2011 | Suh et al. | 438/29 |
| 8,043,887 B2 * | 10/2011 | Yang et al. | 438/99 |
| 2004/0023447 A1 * | 2/2004 | Hirakata et al. | 438/149 |
| 2006/0081849 A1 * | 4/2006 | Lee et al. | 257/72 |
| 2006/0197884 A1 * | 9/2006 | Kim et al. | 349/43 |
| 2006/0267489 A1 * | 11/2006 | Saafir et al. | 313/506 |
| 2006/0289858 A1 * | 12/2006 | Park et al. | 257/40 |
| 2007/0023837 A1 | 2/2007 | Lee et al. | 257/347 |
| 2007/0087487 A1 | 4/2007 | Honda | 438/149 |
| 2007/0103613 A1 * | 5/2007 | Song et al. | 349/43 |
| 2007/0114524 A1 * | 5/2007 | Oh et al. | 257/40 |
| 2007/0114525 A1 * | 5/2007 | Lee et al. | 257/40 |
| 2007/0120471 A1 * | 5/2007 | Yamazaki et al. | 313/506 |
| 2007/0134832 A1 * | 6/2007 | Oh et al. | 438/30 |
| 2007/0166855 A1 * | 7/2007 | Lee et al. | 438/29 |
| 2007/0172586 A1 * | 7/2007 | Tachikawa et al. | 427/162 |
| 2007/0207265 A1 * | 9/2007 | Tachikawa et al. | 427/162 |
| 2007/0218674 A1 | 9/2007 | Maekawa et al. | 438/597 |
| 2007/0229424 A1 | 10/2007 | Hayashi et al. | |
| 2008/0023695 A1 * | 1/2008 | Cho et al. | 257/40 |
| 2008/0035919 A1 * | 2/2008 | Shin et al. | 257/40 |
| 2008/0067503 A1 * | 3/2008 | Kim et al. | 257/40 |
| 2008/0131986 A1 * | 6/2008 | Lee et al. | 438/29 |
| 2008/0197345 A1 * | 8/2008 | Kim et al. | 257/40 |
| 2008/0246905 A1 | 10/2008 | Chen et al. | |
| 2009/0045396 A1 * | 2/2009 | Hahn et al. | 257/40 |
| 2009/0057564 A1 | 3/2009 | Miyayama et al. | |
| 2010/0006832 A1 * | 1/2010 | Oh et al. | 257/40 |
| 2010/0248421 A1 * | 9/2010 | Kim et al. | 438/99 |
| 2011/0014736 A1 * | 1/2011 | Kim et al. | 438/34 |

FOREIGN PATENT DOCUMENTS

| | | |
|---|---|---|
| CN | 1511863 A | 7/2004 |
| CN | 1622708 A | 6/2005 |
| CN | 1639884 A | 7/2005 |
| JP | 2000-269504 | 9/2000 |
| JP | 2000-329928 | 11/2000 |
| JP | 2000-332233 | 11/2000 |
| JP | 2002-083946 | 3/2002 |
| JP | 2003-337353 | 11/2003 |
| JP | 2003-337353 A | 11/2003 |
| JP | 2004-080026 | 3/2004 |
| JP | 2004-096082 | 3/2004 |
| JP | 2004-134694 | 4/2004 |
| JP | 2004-0235579 | 8/2004 |
| JP | 2004-363560 | 12/2004 |
| JP | 2004-363560 A | 12/2004 |
| JP | 2005-043424 | 2/2005 |
| JP | 2005-159328 | 6/2005 |
| JP | 2006-343229 | 12/2006 |
| JP | 2008-182247 | 8/2008 |
| KR | 10-2005-0023012 | 3/2005 |
| KR | 10-2005-0023012 A | 3/2005 |
| KR | 1020070003179 A | 1/2007 |
| KR | 1020080028270 A | 3/2008 |
| KR | 1020080062932 A | 7/2008 |
| KR | 1020080095626 A | 10/2008 |
| KR | 1020080107221 A | 12/2008 |
| TW | 549007 | 8/2003 |
| TW | I237518 | 8/2005 |

OTHER PUBLICATIONS

Patent Abstracts of Japan, Publication No. 2004-363560, Dec. 24, 2004, 1 p.

Korean Patent Abstracts, Publication No. 1020050023012, Mar. 9, 2005, 1 p.

* cited by examiner

DISPLAY DEVICE AND MANUFACTURING METHOD THEREOF

CROSS-REFERENCE TO RELATED APPLICATION

This application is a divisional of U.S. patent application Ser. No. 11/601,086, filed Nov. 17, 2006, which claims priority to Patent Application No. 2006-0111023, filed on Nov. 19, 2005, in the Korean Intellectual Property Office, Republic of Korea, the entire content of which is hereby incorporated by reference.

BACKGROUND (a) Field of the Invention

The present invention relates to a display device and a manufacturing method thereof, and more particularly, to a display device including an organic thin film transistor (OTFT) and a manufacturing method thereof.

(b) Description of Related Art

Among various display devices, the flat display device with its small and lightweight characteristics has recently become more prominent. A liquid crystal display (LCD), such as an organic light emitting diode (OLED) device or the like, is used as such a flat display device and includes at least one thin film transistor to realize an image. The thin film transistor (TFT), which is a switching or driving device for controlling or driving an operation of each pixel, respectively, comprises a gate electrode, a gate insulating film covering the gate electrode and a semiconductor layer positioned on the gate insulating film. Here, the semiconductor layer uses amorphous silicon or poly silicon, and applications of an organic semiconductor have recently increased.

Because the organic semiconductor (OSC) may be formed under normal temperature and pressure, there is an advantage in that manufacturing cost can be reduced, and the OSC can be applied to a thermally weak plastic substrate. Such an OSC may be formed through a simple ink jet method without complicated processes of coating, light exposing and developing and the like. In order to form the OSC through the ink jet method, a barrier wall having an opening for exposing a region (channel region) at which the OSC will be positioned is formed, and an organic semiconductor solution is jetted into the opening, then a process of removing a solvent is used so that an OSC layer is formed.

Because a TFT including an organic semiconductor layer is typically a very small device, it is difficult to control an organic semiconductor solution to be jetted precisely into an opening. Therefore, there may be a problem in that the jetted organic semiconductor solution may be positioned on a barrier wall, and thus the thickness of the organic semiconductor layer becomes different for each pixel so that each organic TFT shows a different characteristic. To solve such a problem, a surface treatment is executed on a barrier wall such that the organic semiconductor solution is flowed into the opening. Through the surface treatment, the surface of the barrier wall has water and oil repellency, and the organic semiconductor solution positioned on the barrier wall is flowed into a closed space. Meanwhile, there is a problem in that a property of a gate insulating film positioned beneath the bottom of the organic semiconductor layer may be changed, and thus the characteristic of the organic TFT may be degraded.

SUMMARY OF THE INVENTION

Accordingly, it is an aspect of the present invention to provide a manufacturing method of a display device wherein characteristics of a TFT can be enhanced. Further, it is another aspect of the present invention to provide a display device wherein characteristics of a TFT are enhanced. Additional aspects and/or advantages of the present invention will be set forth in part in the description which follows and, in part, will be obvious from the description, or may be shown by practicing the present invention.

The foregoing and/or other aspects of the present invention can be achieved by providing a manufacturing method of a display device, comprising: forming a plurality of gate wires comprising a gate electrode on an insulating substrate, forming an electrode layer comprising a source electrode and a drain electrode spaced apart from each other to define a channel region on the gate electrode interposed therebetween, forming a first barrier wall having a first opening for exposing the channel region, a portion of the source electrode, and a portion of the drain electrode on the electrode layer where the first barrier wall has a surface, forming a shielding film to cover the channel region inside the first opening, treating the surface of the first barrier wall, removing the shielding film, and forming an organic semiconductor layer inside the first opening.

According to an aspect of the present invention, the electrode layer comprises a transparent conductive material. According to yet another aspect of the present invention, the forming of the shielding film comprises: forming a shielding material layer, light-exposing using a mask with an aperture of a predetermined pattern, and developing the shielding material layer.

According to an aspect of the present invention, the shielding film is formed through an ink jet method. According to yet another aspect of the present invention, the method further comprises forming a passivation film on the organic semiconductor layer, wherein at least one of the organic semiconductor layer and the passivation film is formed in an ink jet method. According to an aspect of the present invention, the surface treatment comprises at least one of an $O_2$ plasma treatment, a $CF_4$ plasma treatment, and a self-assembled monolayer (SAM) treatment. According to an aspect of the present invention, the method further comprises forming a gate insulating film to cover the gate electrode before forming the electrode layer and after the plurality of gate wires have been formed, wherein the electrode layer is formed including at least one of ITO (Indium Tin Oxide) and IZO (Indium Zinc Oxide). According to an aspect of the present invention, the gate insulating film has a dielectric constant of between about 1 to about 3.

According to an aspect of the present invention, the organic semiconductor layer comprises any one material selected from the group consisting of a first derivative material consisting of tetracene or pentacene substituents, oligothiophene with 4 to 8 thiophene rings coupled to one another through 2- and 5-positions of the thiophene rings, one of perylenetetracarboxlic dianhidride (PTCDA) or an imide derivative thereof, one of naphthalenetetracarboxlic dianhydride (NTCDA) or an imide derivative thereof, one of metallized pthalocyanine or a halogenated derivative thereof, one of perylene or coronene and one of a derivative including substituents thereof, co-oligmer or co-polymer of one of thienylene and vinylene, thiophene, one of thienylene or coronene, and a second derivative material containing substituents thereof, and a derivative including at least one hydrocarbon chain with 1 to 30 carbons in an aromatic or heteroaromatic ring of said second derivative material.

According to an aspect of the present invention, the method further comprises: forming a plurality of data wires which are both insulated from and which cross the plurality of gate wires to define a pixel between the insulating substrate and the plurality of gate wires, and forming an interlayer insulating film on the plurality of data wires. According to an aspect of the present invention, the interlayer insulating film comprises a lower first interlayer insulating film and an upper second interlayer insulating film, the first interlayer insulating film being made of an inorganic film comprising at least one of silicon nitride (SiNx) or silicon oxide (SiOx), the second interlayer insulating film being made of an organic film including an organic material.

According to an aspect of the present invention, the forming of the interlayer insulating film comprises: forming a second barrier wall with a second opening for exposing the gate electrode on the interlayer insulating film, and forming the gate insulating film inside the second opening through an ink jet method.

According to an aspect of the present invention, the passivation film comprises a lower first passivation film and an upper second passivation film, the first passivation film comprises a material selected from the group consisting of cyclized transparent polymers obtained from a copolymerization of PTFE (Poly Tetra Fluoro Ethylene), FEP (Fluorinated Ethylene Propylene), PFA (Poly Fluoro Alkoxy), ETFE (Ethylene Tetra Fluoro Ethylene), PVDF (Polyvinylidene Fluoride) or perfluoro (alkenylvinyl ethers), and the second passivation film comprises one of ITO (Indium Tin Oxide) and IZO (Indium Zinc Oxide).

The foregoing and/or other aspects of the present invention can be achieved by providing a manufacturing method of a display device, comprising: forming a plurality of gate wires comprising a gate electrode on an insulating substrate, forming a gate insulating film on the gate electrode, forming an electrode material layer on the gate insulating film, forming a first barrier wall on the electrode material layer, the first barrier wall having a first opening for exposing at least a portion of the electrode material layer on the electrode material layer, treating a surface of the first barrier wall, forming and electrode layer comprising a source electrode and a drain electrode that are spaced apart from each other on the gate electrode by patterning the electrode material layer, and forming an organic semiconductor layer inside the first opening.

According to an aspect of the present invention, the electrode material layer comprises a transparent conductive material. According to an aspect of the present invention, wherein forming the electrode layer comprises: forming a photosensitive film on the first barrier wall and the electrode material layer, positioning a mask with an aperture of a predetermined pattern on the photosensitive film, light-exposing a portion of the photosensitive film through the mask aperture, developing the photosensitive film such that only the photosensitive film corresponding to a region to be formed as the electrode layer remains, etching the electrode material layer using the photosensitive film, and removing the photosensitive film.

According to an aspect of the present invention, the method further comprises: forming a plurality of data wires which are insulated from and which cross the gate wires to define a pixel between the insulating substrate and the gate wires, and forming an interlayer insulating film to cover the data wires. According to an aspect of the present invention, the forming of the gate insulating film comprises: forming a second barrier wall with a second opening for exposing the gate electrode on the interlayer insulating film, and forming the gate insulating film inside the second opening through an ink jet method.

According to an aspect of the present invention, the plurality of data wires include a data line, and the method further comprising: forming simultaneously a barrier wall contact hole for exposing a portion of the interlayer insulating film together with the second opening on the second barrier wall, and forming an insulating film contact hole on the interlayer insulating film to expose a portion of the data line that corresponds to the barrier wall contact hole.

According to an aspect of the present invention, the method further comprises: forming an insulating film contact hole for exposing a portion of the data line on the interlayer insulating film after the interlayer insulating film has been formed, and forming simultaneously a barrier wall contact hole corresponding to the insulating film contact hole together with the second opening on the second barrier wall.

The foregoing and/or another aspects of the present invention can be achieved by providing a display device comprising: a plurality of gate wires comprising a gate electrode formed on an insulating substrate, a gate insulating film formed on the gate electrode, a transparent electrode layer including source and drain electrodes that are spaced apart from each other on the gate insulating film to define a channel region with the gate electrode interposed therebetween, and an organic semiconductor layer formed on the channel region, wherein the surfaces of the respective source and drain electrodes have a reactivity that is different from each other for an self-assembled monolayer (SAM) treatment.

According to an aspect of the present invention, ends of the source and drain electrodes facing to each other on the gate insulating film have a low reactivity for the SAM (self-assembled monolayer) treatment as compared with portions except the ends thereof.

It is to be understood that both the foregoing general description and the following detailed description are exemplary and explanatory and are intended to provide further explanation of the invention as claimed.

BRIEF DESCRIPTION OF THE DRAWINGS

The above and/or other aspects and advantages of the prevent invention will become apparent and more readily appreciated from the following description of the exemplary embodiments, taken in conjunction with the accompany drawings, in which:

FIGS. 3A to 3K show views illustrating a manufacturing method of a display device according to the first embodiment of the present invention.

Figure 1:
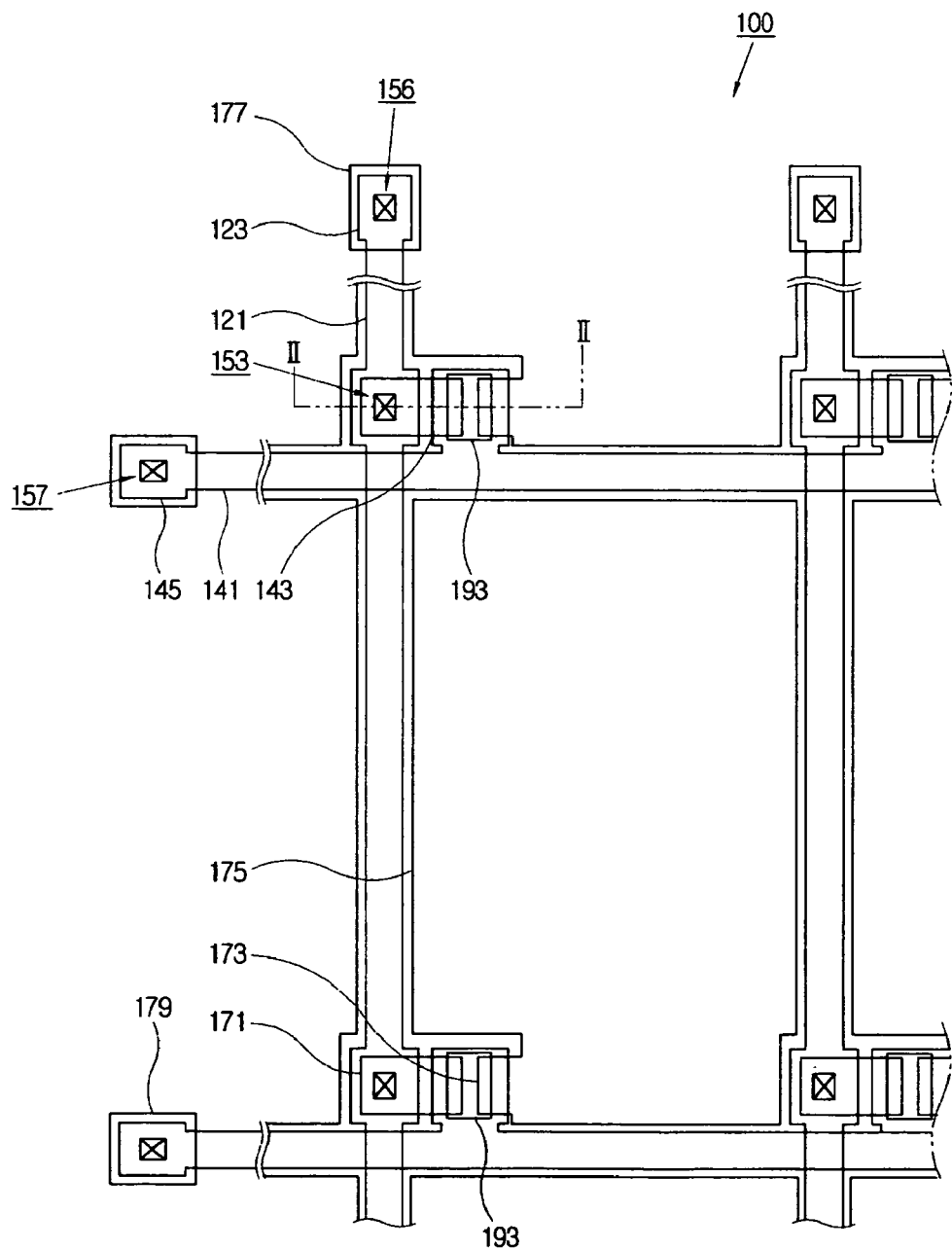
FIG. 1 shows a layout view of a thin film transistor (TFT) substrate according to a first embodiment of the present invention.

DETAILED DESCRIPTION OF THE ILLUSTRATIVE, NON-LIMITING EMBODIMENTS OF THE INVENTION

Reference will now be made in detail to the embodiments of the present invention, examples of which are illustrated in the accompanying drawings, wherein like reference numerals refer to like elements throughout. The embodiments are described below so as to explain the present invention with reference to the figures. It will be understood that if one film (layer) is formed (located) "on" another film (layer), this includes not only the case where two films (layers) are in contact with each other but also includes the case where another film (layer) is interposed between two films (layers). Finally, terms like above, below, upper, and lower, are relative position terms and describe the position of one element in reference to another element based on a particular orientation or frame of reference that may or may not be shown in the drawings. Hence, when the described element, combination, apparatus, or a portion thereof is turned over, a first element that was above a second element prior to the turning may now be oriented below that second element after the turning. Hence, these terms are not considered limiting.

Figure 2:
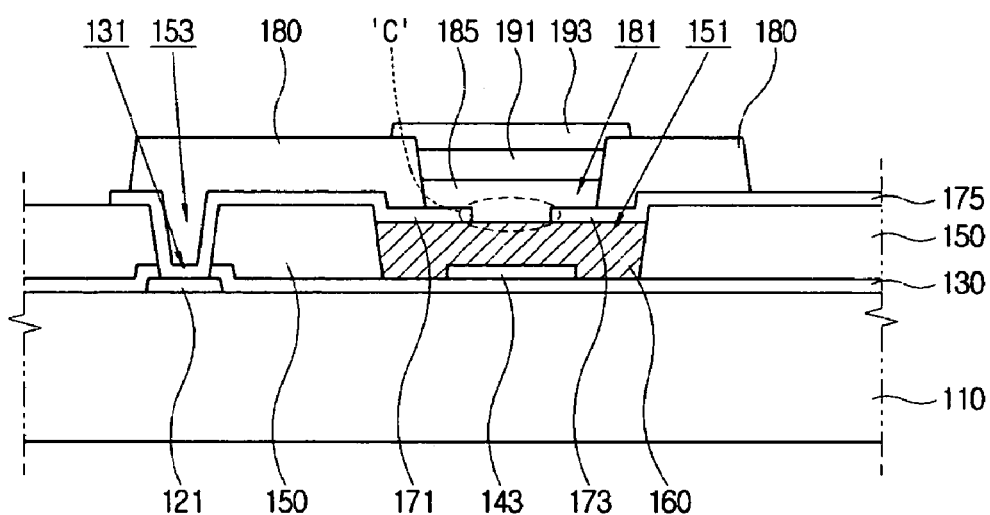
FIG. 2 shows a cross-sectional view taken along line II-II in FIG. 1.

FIG. 1 illustrates a layout view of a thin film transistor (TFT) substrate according to a first embodiment of the present invention, and FIG. 2 shows a cross-sectional view taken along line II-II in FIG. 1. The TFT substrate 100 according to an embodiment of the present invention comprises an insulating substrate 110; data wires 121 and 123 formed on the insulating substrate 110; an interlayer insulating film 130 formed on the data wires 121 and 123; gate wires 141, 143 and 145 formed on the interlayer insulating film 130; a second barrier wall 150 having a second opening 151 for exposing at least a portion of the gate wires 141, 143 and 145, and a barrier wall contact hole 153; a gate insulating film 160 formed inside the second opening 151; electrode layers 171, 173, 175, 177 and 179 including source and drain electrodes 171 and 173 which are spaced apart from each other with a gate electrode 143 disposed therebetween to define a channel region 'C'; a first barrier wall 180 having a first opening 181 for exposing the channel region 'C', a portion of the source electrode 171 and a portion of the drain electrode 173 on the electrode layers 171, 173, 175, 177 and 179; and an organic semiconductor layer 185 formed inside the first opening 181.

The insulating substrate 110 may be made of glass or plastic. In a case where the insulating substrate 110 is made of plastic, there is an advantage in that flexibility can be imparted to the TFT substrate 100, but there is a disadvantage in that the insulating substrate 110 is thermally weak. Because the formation of a semiconductor layer can be performed under normal temperature and pressure if the organic semiconductor layer 185 of an embodiment of the present invention is used, there is an advantage in that it is easier to use the insulating substrate 110 made of a plastic material. Here, polycarbonate, polyimide, PES (polyethersulfone), PAR (polyarylate), PEN (polyethylenenapthalate), PET (polyethylene terephthalate) or the like is possible to be used as the plastic material.

The data wires 121 and 123 are formed on the insulating substrate 110. The data wires 121 and 123 comprise a data line 121 formed to extend in one direction on the insulating substrate 110 and a data pad 123 which is formed at an end of the data line 121 to receive a drive or control signal from the outside. The data pad 123 receives an external drive or control signal and then applies the drive and control signal to the data line 121. As a material of the data line 121 may include at least any one of the elements Al, Cr, Mo, Au, Pt, Pd, Cu and the compound AlNd. Further, the data wires 121 and 123 may be formed as a single layer or multi layers including at least any one of the above materials.

In an embodiment the present invention, a structure where the data wires 121 and 123 are first formed, and the interlayer insulating film 130 is then formed on the data wires 121 and 123 is selected to prevent a property of the organic semiconductor layer 185 from being degraded by protecting the gate insulating film 160 from chemical substances or plasma, which is used in a process of forming the data wires 121 and 123.

The interlayer insulating film 130 covers the data wires 121 and 123 on the insulating substrate 110. The interlayer insulating film 130 is a layer for electrical insulation between the data wires 121 and 123, and the gate wires 141, 143 and 145, and may be an organic film containing an organic material with a superior durability or an inorganic film with a superior workability property comprising a capability of being worked, handled, or dealt with in some manner. As another embodiment, the interlayer insulating film 130 may be composed of multi layers, in which an inorganic film made of an inorganic material such as silicon nitride (SiNx) or silicon oxide (SiOx), which has a superior workability property, may be positioned at a lower portion and an organic film may be positioned at an upper portion. That is, the inorganic film may be omitted depending on a workability property of the organic film. On the interlayer insulating film 130 are formed an insulating film contact hole 131 for exposing a portion of the data line 121 and a contact hole (not shown) for exposing the data pad 123. Because a chemical material or plasma used when the data wires 121 and 123 are formed is remained and then flowed into a gap or interface among the insulating film contact hole 131, the barrier wall contact hole 153 and the second opening 151, such an interlayer insulating film 130 is formed to reduce the damage of a property of the organic semiconductor layer 185 to be described later, which is weak for chemical and plasma resistance.

On the interlayer insulating film 130 are formed the gate wires 141, 143 and 145. The gate wires 141, 143 and 145 comprise a gate line 141 which is insulated from and crosses the data line 121 to define a pixel region, a gate electrode 143 which branches from the aforementioned gate line 141 and is formed at a place corresponding to the organic semiconductor layer 185 (described later) and a gate pad 145 formed at an end of the gate line 141 to receive a drive or control signal form the outside. The gate pad 145 receives a drive or control signal applied for turning on/off the TFT from the outside and then transmits it to the gate electrode 143 via the gate line 141. Like the data wires 121 and 123, the gate wires 141, 143 and 145 may include at least any one of the elements Al, Cr, Mo, Au, Pt, Pd, Cu and the compound AlNd, and be formed as a single layer or as multi layers.

On the interlayer insulating film 130 are formed the second opening 151 for exposing at least a portion of the gate wires 141, 143 and 145, and the second barrier wall 150 having the barrier wall contact hole 153. More specifically, the second barrier wall 150 comprises the second opening 151 for exposing the gate electrode 143, the barrier wall contact hole 153 for exposing a portion of the data line 121 to correspond to the aforementioned insulating film contact hole 131 and contact holes 156 and 157 for respectively exposing the data pad 123 and the gate pad 145. The second barrier wall 150 is provided to form the gate insulating film 160 through an ink jet method and may include a photosensitive organic film containing an organic material. The ink jet method is a generically used description for a non-contact deposition method where a fine mist of material is emitted against a substrate to form a desired material layer. Further, it is preferred that the second opening 151 be formed to be large, so that the top surface of the gate insulating film 160 on the gate electrode 143 may remain flat. A gate insulation film material jetted into the second opening 151 is formed as the gate insulating film 160 by removing a solvent. In the process of removing the solvent, the gate insulating film 160 is dried in a state where the thickness of an edge region thereof is thick, and that of a center region thereof is thin and flat similar to the shape of a serving plate. This is referred to as a coffee stain phenomenon. By such a coffee stain phenomenon, if the gate insulating film 160 is dried on the gate electrode 143 in a state that the thicknesses of the edge and center regions of the gate insulating film 160 are different from each other, a characteristic of the TFT may be degraded. Accordingly, the second opening 151 is largely formed so that an area where the edge region to be thick in thickness is overlapped with the gate electrode 143 is minimized, thereby minimizing the degradation of a characteristic of the TFT.

In the second opening 151 formed the gate insulating film 160. The gate insulation film 160 functions to mutually insulate the data wires 121 and 123, and the gate wires 141, 143 and 145, and prevent impurities from flowing into the organic semiconductor layer 185, which may be damaged by chemicals and plasma. The gate insulation film 160 may be a thick film formed including at least any one of an acryl-based resin with a low dielectric constant, a polystyrene-based resin, or benzocyclobutene. Preferably, the gate insulation film 160 according to an embodiment of the present invention uses a material with a superior durability and a low dielectric constant. This is so that the capacitance ($C_{gd}$ or $C_{gs}$) between the source or drain electrodes 171 or 173, and the gate electrode 143 (described later) is decreased so that a characteristic of an organic TFT (O-TFT) is enhanced. Preferably, the gate insulating film 160 has the dielectric constant of between about 1 to about 3.

On the second barrier wall 150 and the gate insulation film 160 are formed the electrode layers 171, 173, 175, 177 and 179. The electrode layers 171, 173, 175, 177 and 179 include a source electrode 171 connected to the data line 121 through the insulating film contact hole 131 and the barrier wall contact hole 153, and contacted with at least a portion of the organic semiconductor layer 185; a drain electrode 173 separated from the source electrode 171 with the gate electrode 143 interposed therebetween and a pixel electrode 175 which is connected to the drain electrode 173 to form a pixel. Further, the electrode layers 171, 173, 175, 177 and 179 further include a data pad contact member 177 connected to the data pad 123 and a gate pad contact hole 179 connected to the gate pad 145. The electrode layers are made of a transparent conductive material such as ITO (Indium Tin Oxide) or IZO (Indium Zinc Oxide). The source electrode 171 is physically and electrically connected to the data line 121 through the contact holes 131 and 153 to receive a pixel signal. Further, the drain electrode 173 defining the channel region 'C' while spacing apart from the source electrode 171 with the gate electrode 143 interposed therebetween forms the TFT together with the source electrode 171 and is operated as a switching or driving device for controlling or driving an operation of each of the pixel electrodes 175.

Here, the surfaces of the respective source and drain electrodes 171 and 175 have a reactivity that is different from each other for a SAM (self-assembled monolayer) treatment. That is, the ends of the source and drain electrodes 171 and 173 covered by a shielding film 183 (referring to FIG. 3H) to be described later may have low reactivity for the SAM (self-assembled monolayer) treatment as compared with the source and drain electrodes 171 and 173 of another region. This is because the ends of the source and drain electrodes 171 and 173 covered by the shielding film 183 an so are not exposed to $O_2$ plasma treatment when performing an $O_2$ plasma treatment. In general, the $O_2$ plasma treatment is performed to increase a cleaning effect and a concentration of a self-assembled monolayer (SAM) formed in the SAM treatment. Accordingly, interface properties between the organic semiconductor layer 185 and the source electrode 171, and the drain electrode 173 and the gate insulating film 160 are enhanced so that a characteristic of the O-TFT is improved.

On the source and drain electrodes 171 and 173 is formed the first barrier wall 180. The first barrier wall 180 forms the first opening 181 for exposing a portion of each of the source and drain electrodes 171 and 173 while surrounding the channel region 'C'. The first barrier wall 180 functions as a frame used to form the organic semiconductor layer 185.

In the first opening 181 is formed the organic semiconductor layer 185. The organic semiconductor layer 185 is contacted with at least a portion of the source and drain electrodes 171 and 173 while covering the channel region 'C'. The organic semiconductor layer 185 may be any one selected from the group consisting of a derivative including tetracene or pentacene substituents; oligothiophene with 4 to 8 thiophene rings coupled to one another through 2- and 5-positions of the thiophene rings; perylenetetracarboxlic dianhidride (PTCDA) or an imide derivative thereof; naphthalenetetracarboxlic dianhydride (NTCDA) or an imide derivative thereof; metallized pthalocyanine or a halogenated derivative thereof; or perylene or coronene and a derivative including substituents thereof; co-oligmer or co-polymer of thienylene and vinylene; thiophene; thienylene or coronene, and a derivative containing substituents thereof; and a derivative including at least one hydrocarbon chain with 1 to 30 carbons in an aromatic or heteroaromatic ring of said material. In addition, the organic semiconductor layer 185 may use any known organic semiconductor material that is generally used.

On the organic semiconductor layer 185 is formed a first passivation layer 191. The first passivation layer 191 covers the organic semiconductor layer 185 and is formed including a fluorine-based polymer. The fluorine-based polymer may be made of any one of the group consisting of cyclized transparent polymers obtained from a copolymerization of PTFE (Poly Tetra Fluro Ethylene), FEP (Fluorinated Ethylene Propylene), PFA (Poly Fluoro Alkoxy), ETFE (Ethylene Tetra Fluoro Ethylene), PVDF (Polyvinylidene Fluoride) or perfluoro (alkenylvinyl ethers). Contrary thereto, the first passivation layer 191 may be an organic film made of at least any one of materials of poly vinyl alcohol (PVA), benzocyclobutene (BCB), acryl-based resin, silicon polymer (Si polymer) and the like. The first passivation layer 191 serves as a layer for preventing a property of the organic semiconductor layer 185 from being degraded.

Further, a second passivation layer 193 may be further formed on the first passivation layer 191. The second passivation layer 193 alternately serves as a layer for preventing a property of the organic semiconductor layer 185 from being degraded like the first passivation layer 191. The second passivation layer 193 may be made of either ITO (Indium Tin Oxide) and IZO (Indium Zinc Oxide). In addition the second passivation layer 193 may be made of the same material as the first passivation layer 191 or another known material.

A manufacturing method of a flat display device according to the first embodiment of the present invention will be described below with reference to FIGS. 3A to 3K.

Figure 3A:
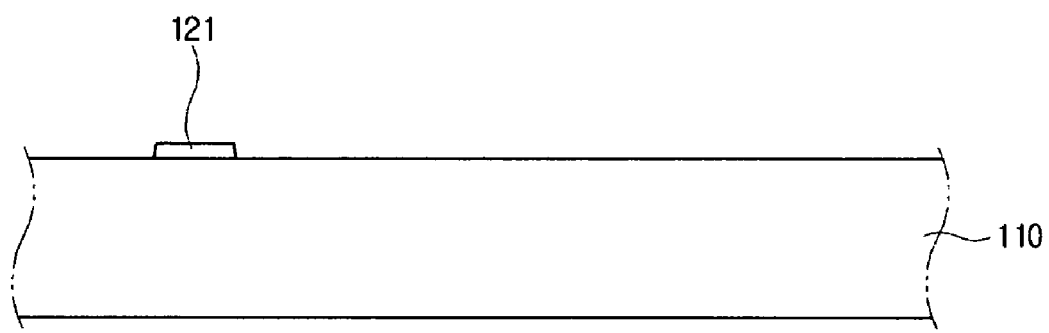

First, an insulating substrate 110 formed including an insulating material of glass, quartz, ceramic, plastic or the like is provided as shown in FIG. 3A. It is preferred that a plastic substrate be used in manufacturing a flexible display device. Subsequently, after a data wiring material is deposited on the insulating substrate 110 through a method of sputtering or the like, a data line 121 and a data pad (not shown) are formed through a photolithography process.

Figure 3B:
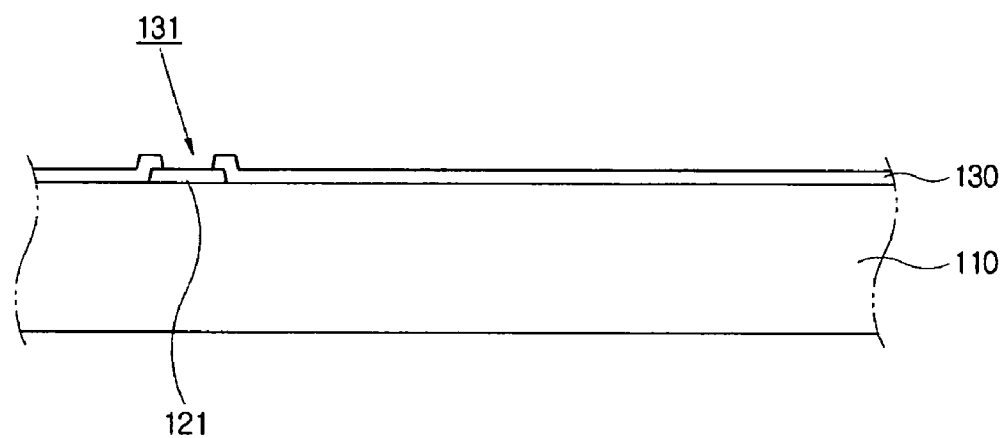

Further, an interlayer insulating film 130 is formed by supplying a interlayer insulating material made of an inorganic material of silicon nitride (SiNx), silicon oxide (SiOx) or the like on the insulating substrate 110 and the data line 121 as shown in FIG. 3B. In a case where the interlayer insulating material is an inorganic material, the interlayer insulating film 130 may be formed through a chemical vapor deposition (CVD) method. As another embodiment, the interlayer insulating film 130 may be an organic film, and the interlayer insulating material may be formed on the insulating substrate 110 through a method of spin coating, screen printing or the like in this case. Both of the organic and inorganic films may be applied to the interlayer insulating film 130, and an insulating film contact hole 131 for exposing a portion of the data line 121 is formed through an etching process using a photosensitive organic film or the like as a shielding wall.

Figure 3C:
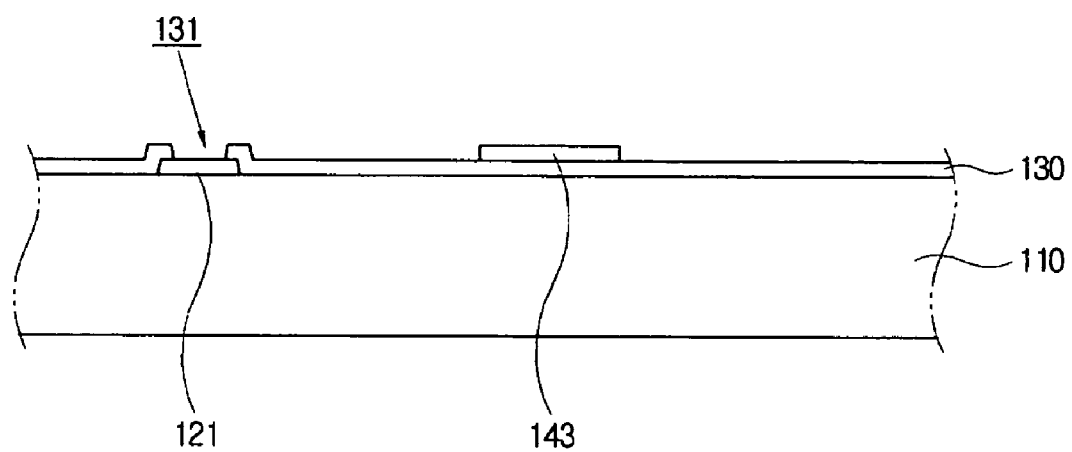

Next, after a gate wiring material including at least any one of the elements Al, Cr, Mo, Au, Pt, Pd, Cu and the compound AlNd is deposited on the interlayer insulating film 130 through a method of sputtering or the like, a gate line (not shown), a gate electrode 143 and a gate pad (not shown) are formed through a photolithography process as shown in FIG. 3C.

Figure 3D:
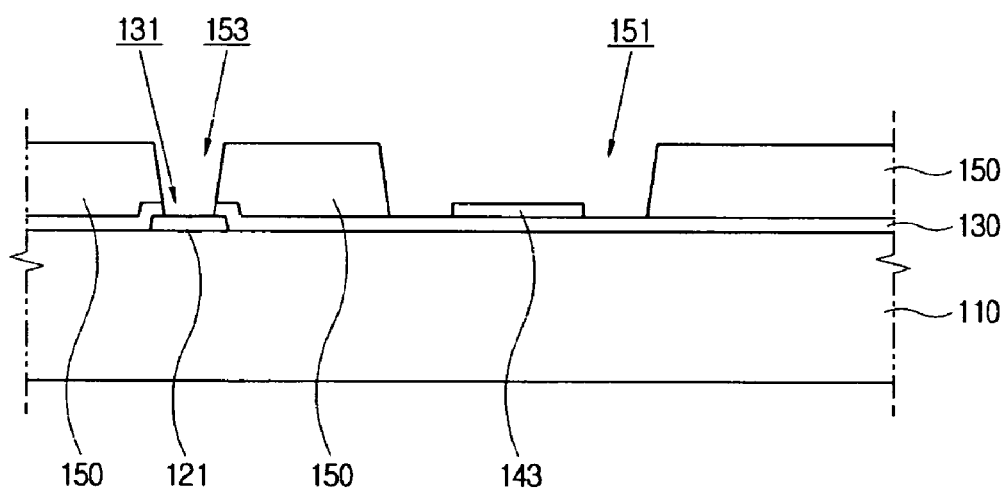

Thereafter, a second barrier wall 150 is formed having a second opening 151 for exposing the gate electrode 143 and a barrier wall contact hole 153 for exposing a portion of the data line 121 and corresponding to the insulating film contact hole 131 as shown in FIG. 3D. The second barrier wall 150 may be a photosensitive organic film, and a method of forming the second barrier wall 150 is as follows: First, an organic film is formed on the interlayer insulating film 130 having a predetermined thickness through a method of spin coating, screen printing or the like. Further, after a mask having an aperture of a predetermined pattern is aligned and arranged on the organic film, the organic film is exposed by light. Finally, the organic film is developed to form the second opening 151 and the barrier wall contact hole 153 so that the second barrier wall 150 shown in FIG. 3D is fabricated.

Figure 3E:
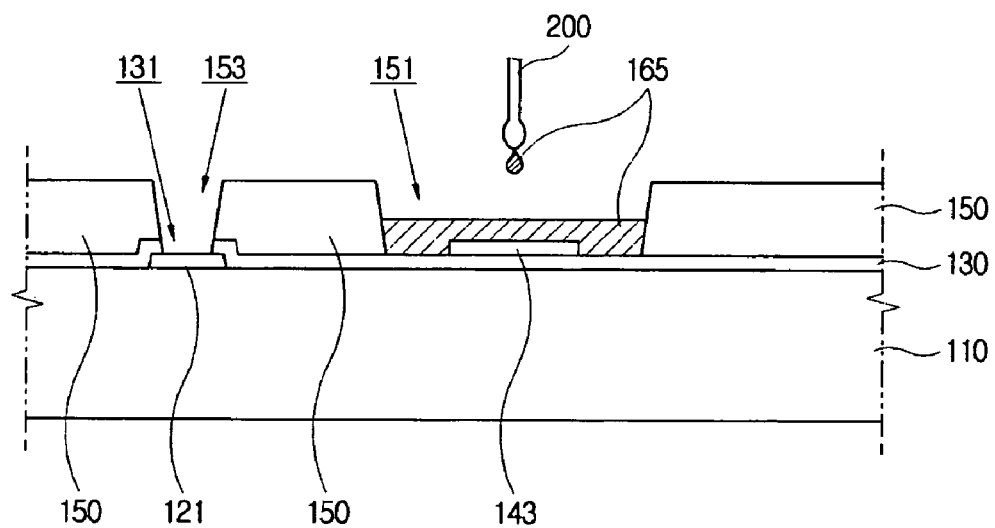
Figure 3F:
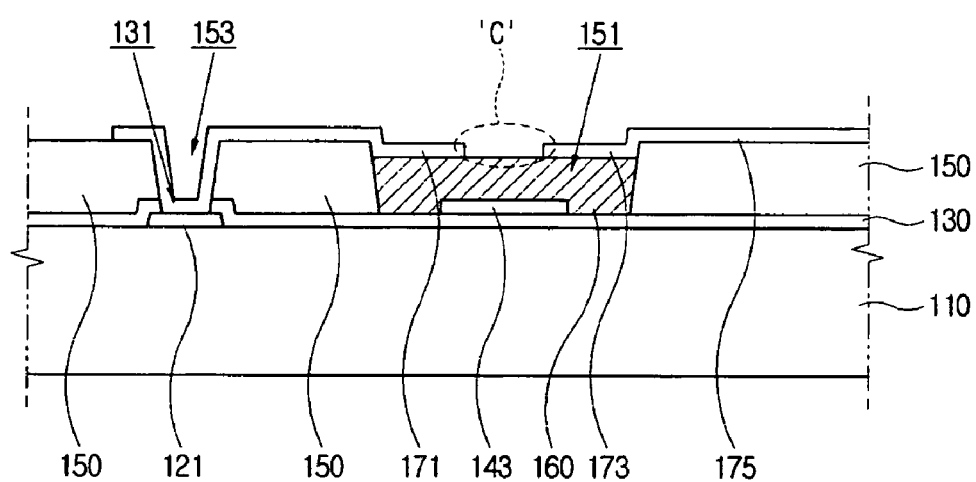

Thereafter, a gate insulating material 165 formed including at least any one of acryl-based resin with a low dielectric constant, polystyrene-based resin and benzocyclobutene is jetted into the second opening 151 using a nozzle 200 as shown in FIG. 3E. Here, it is preferred that the gate insulating material 165 with a dielectric constant of between about 1 to about 3 be used. This is so that the capacity ($C_{gd}$ or $C_{gs}$) between the source or drain electrodes 171 or 173 (referring to FIG. 3F), and gate electrode 143 is decreased so that a characteristic of an organic TFT (O-TFT) is enhanced. The gate insulation material 165 is passed through a solvent removing process and then formed as a gate insulating film 160 as shown in FIG. 3F. Here, it is preferred that the second opening 151 be largely formed to minimize the degradation of a characteristic of a TFT due to the coffee stain phenomenon.

Meanwhile, although not shown in this figure, an operation of treating the surface of the second barrier wall 150 before jetting the gate insulating material 165 is further included in this embodiment so that the gate insulating material 165 jetted onto the surface of the second barrier wall 150 flows inside the second opening 151 automatically. The surface treatment includes at least any one of $O_2$ and $CF_4$ plasma treatments, and the surface of the second barrier wall 150 is made water and oil repellant by the surface treatment. Next, after a transparent conductive metal oxide material (transparent conductive material) such as ITO (Indium Tin Oxide) or IZO (Indium Zinc Oxide) is formed on the second barrier wall 150 and the gate insulating film 160 through sputtering, electrode layers 171, 173, 175, 177 and 179 are formed using a photolithography or etching process as shown in FIG. 3F. The electrode layers 171, 173, 175, 177 and 179 include a source electrode 171 connected to the data line 121 through the insulating film contact hole 131 and the barrier wall contact hole 153 and contacted with at least a portion of the organic semiconductor layer 185, a drain electrode 173 separated from the source electrode 171 with the gate electrode 143 interposed therebetween to define the channel region 'C' and a pixel electrode 175 which is connected to the drain electrode 173 and formed in a pixel. Further, the electrode layers 171, 173, 175, 177 and 179 further include a data pad contact member 177 connected to the data pad 123 and a gate pad contact hole 179 connected to the gate pad 145.

Figure 3G:
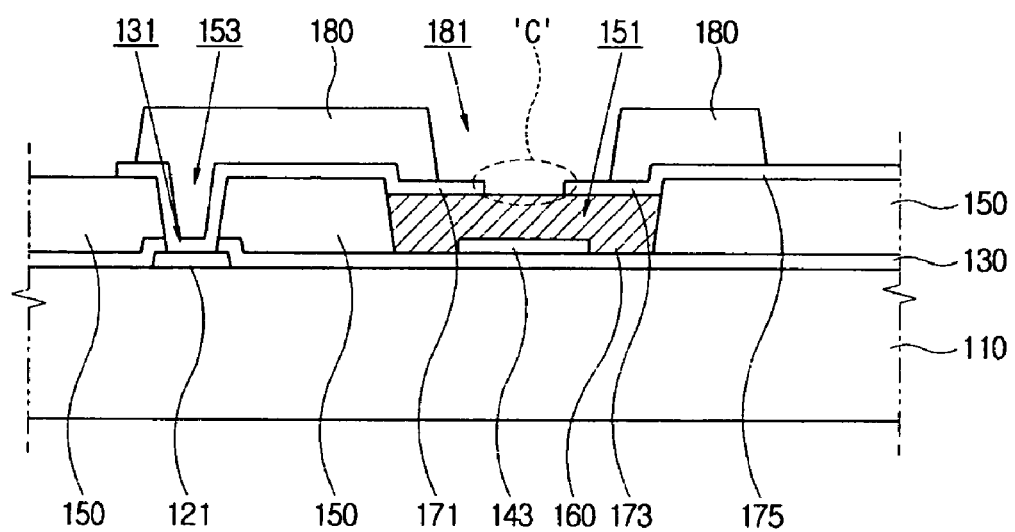

Subsequently, a first barrier wall 180 is formed to have a first opening 181 for exposing portions of the respective source and drain electrodes 171 and 173 while surrounding the channel region 'C' as shown in FIG. 3G. The first barrier wall 180 functions as a frame for forming the organic semiconductor layer 185. The first barrier wall 180 may be a photosensitive film, and a method of forming the first barrier wall 180 is as follows: First, an organic film with a predetermined thickness is formed on a portion of the source, drain and pixel electrodes 171, 173 and 175 through a method of spin coating, screen printing or the like. Further, after a mask having an aperture of a predetermined pattern is aligned and arranged on the organic film, the organic film is exposed by light. Finally, the organic film is developed to form the first opening 181 so that the first barrier wall 180 shown in FIG. 3G is fabricated or constructed.

Next, the surface of the first barrier wall 180 is treated such that an organic semiconductor solution 186 (referring to FIG. 3K) jetted onto the surface of the first barrier wall 180 flows inside the first opening 181 automatically. However, because such a surface treatment is performed in a state where the channel region 'C' is open, there is a concern that a property of the gate insulating film 160 could be changed due to the plasma used in the surface treatment so that a characteristic of the O-TFT can be degraded. More specifically, the surface of the gate insulating film 160 is also water and oil repellant for the organic semiconductor solution 186 (referring to FIG. 8k) so that it occurs that the jetted organic semiconductor solution 186 (referring to FIG. 3K) is not uniformly spread on the channel region 'C' but rather is condensed at the surroundings of the source and drain electrode 171 and 173. Accordingly, an interface property between the gate insulating film 160 and the organic semiconductor layer 185 (referring to FIG. 2) is undesirable, and the thickness of the organic semiconductor layer 185 (referring to FIG. 2) is not uniform so that the characteristic of the O-TFT is degraded.

Figure 3H:
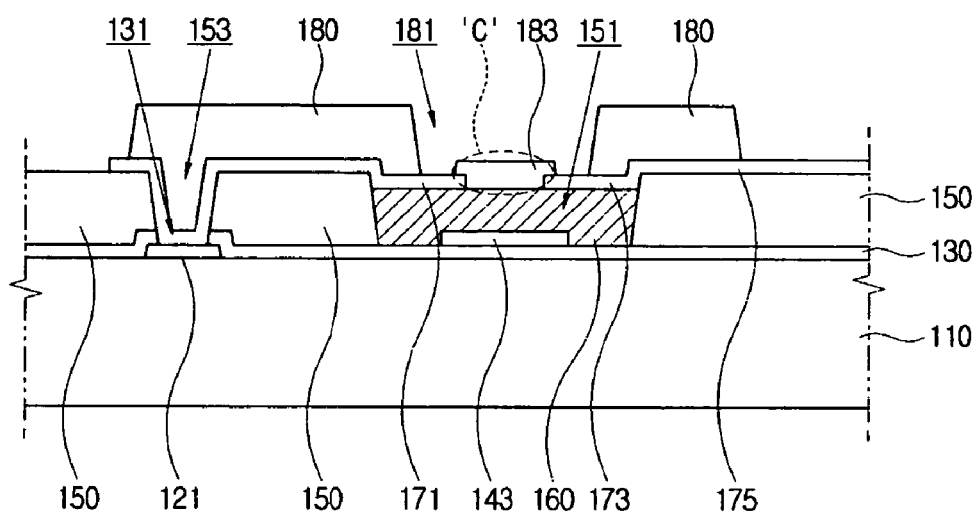
Figure 31:
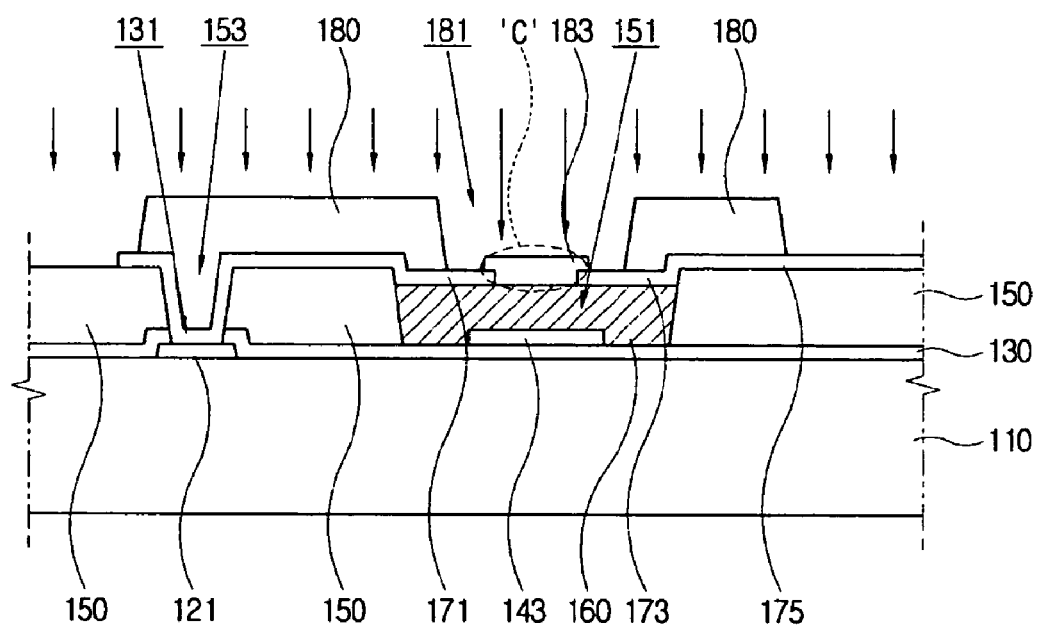

Thus, to shield plasma or chemical substances used in the surface treatment from flowing into the gate insulating film 160 in the present invention, a shielding film 183 is formed to cover the channel region 'C' as shown in FIG. 3H. A method of forming the shielding film 183 is similar in some ways to the aforementioned methods of forming the first and second barrier wall 150 and 180. That is, a shielding material layer is formed by applying a shielding material including a photosensitive organic material inside the first opening 181 and on the first barrier wall 180 or the like. Further, the shielding material layer is exposed by light using a mask with a predetermined aperture on the shielding material layer, and the shielding material is developed so that the shielding film 183 covering only the channel region 'C' is formed. As another embodiment, after the shielding material is jetted into the channel region 'C' through a ink jet method, a solvent removing process is passed through so that the shielding film 183 may be formed.

Subsequently, the surface of the first barrier wall 180 is treated to provide water and oil repellency as shown in FIG. 3I. The surface treatment includes any one of $O_2$ plasma, $CF_4$ plasma and self-assembled monolayer (SAM) treatments. Here, the $O_2$ and $CF_4$ plasma treatments are surface treatments to allow the surface of the first barrier wall 180 to provide water and oil repellency, while the SAM treatment is a treatment to enhance a characteristic of the O-TFT by reducing contact resistance between the organic semiconductor layer 185 (referring to FIG. 2) jetted into the channel region 'C', and the source and drain electrodes 171 and 173, and more facilitating electric charge movement. In addition, through the $O_2$ plasma treatment, the surfaces of the respective source and drain electrodes 171 and 175 have reactivity different from each other for an SAM (self-assembled monolayer) treatment. That is, the ends of the source and drain electrodes 171 and 173 covered by the shielding film 183 (described later) may have low reactivity for the SAM (self-assembled monolayer) treatment as compared with the source and drain electrodes 171 and 173 of another region. This is because the ends of the source and drain electrodes 171 and 173 covered by the shielding film 183 are not subjected to an $O_2$ plasma treatment when performing the $O_2$ plasma treatment. In general, the $O_2$ plasma treatment is performed to increase a cleaning effect and a concentration of a self-assembled monolayer (SAM) formed in the SAM treatment. Accordingly, interface properties between the organic semiconductor layer 185 and the source electrode 171, and the drain electrode 173 and the gate insulating film 160 are enhanced so that a characteristic of the O-TFT is improved.

Figure 3J:
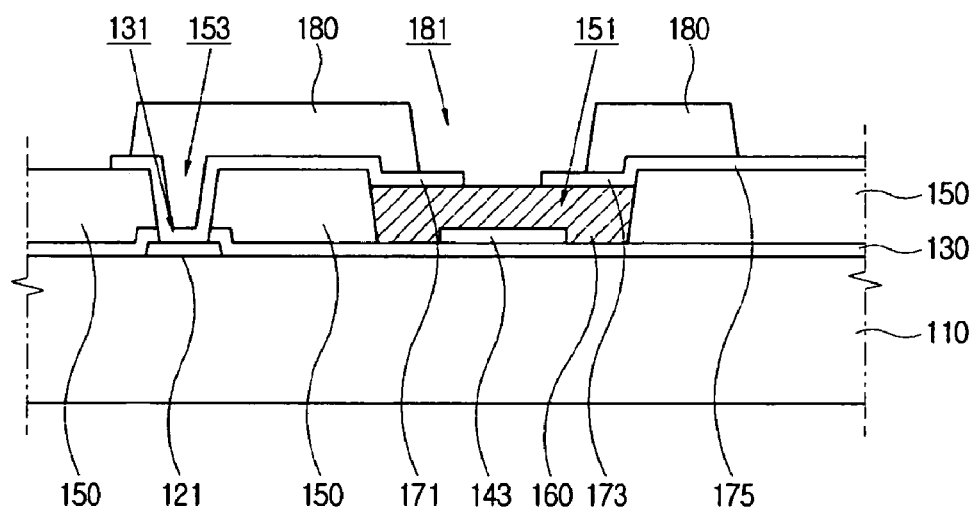
Figure 3K:
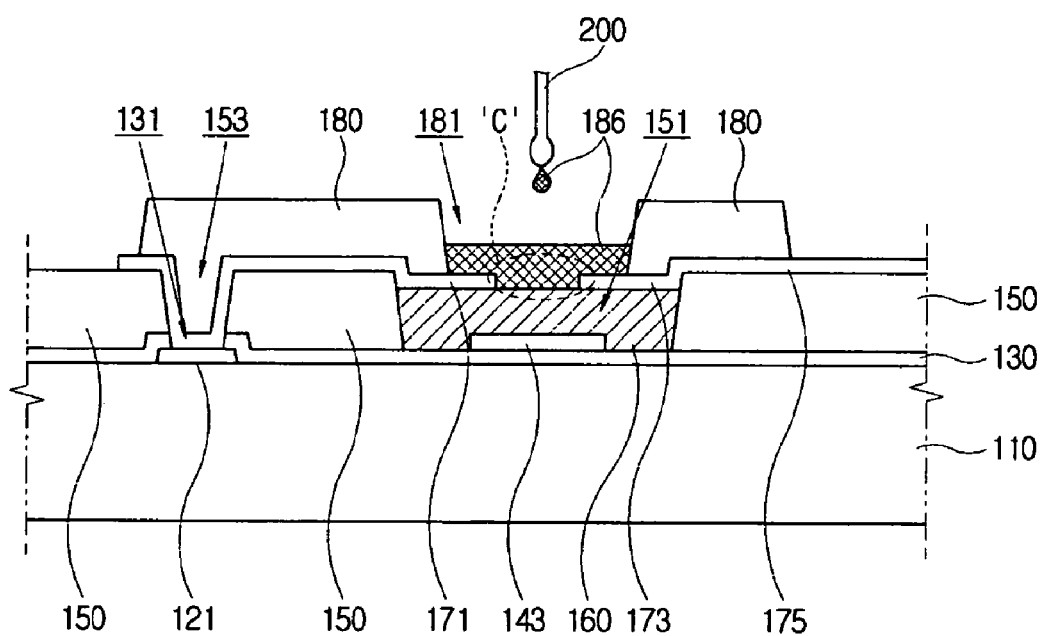

Next, the shielding film 183 is removed as shown in FIG. 3J. Thereafter, the organic semiconductor solution 186 is jetted into the channel region 'C' through a nozzle 200 as shown in FIG. 3H. The organic semiconductor solution 186 may be aqueous or oily depending on a solvent, and the organic semiconductor material is formed as the organic semiconductor layer 185 (referring to FIG. 2) by passing through a solvent removing process. Because the ink jet method enables the organic semiconductor material to form a pattern without a pattering process through a conventional photolithography process, the organic semiconductor layer 185 (referring to FIG. 2) is protected from chemical substances used in the photolithography so that degradation of a characteristic of the O-TFT can be reduced.

In particular, the organic semiconductor layer 183 functions to prevent plasma and chemical substances used in the surface treatment from flowing into the gate insulating film 160 by providing the shielding film 183. Accordingly, the property of the gate insulating film 160 is not changed, and the organic semiconductor solution 186 (referring to FIG. 3K) is uniformly spread on the channel region 'C' so that the characteristic of the O-TFT is enhanced.

Further, although not shown in this figure, a first passivation layer solution is jetted on the organic semiconductor layer 185 in a manner similar to the method of forming the organic semiconductor layer 185 so that a first passivation layer 191 is formed. The passivation layer solution may be aqueous or oily depending on a solvent. The passivation layer solution is formed as the first passivation layer 191 by passing through a solvent removing process, and the first passivation layer 191 is flat. The first passivation layer solution includes a fluorine polymer, and the fluorine polymer may be made of any one of the group consisting of cyclized transparent polymers obtained from a copolymerization of PTFE (Poly Tetra Fluro Ethylene), FEP (Fluorinated Ethylene Propylene), PFA (Poly Fluoro Alkoxy), ETFE (Ethylene Tetra Fluoro Ethylene), PVDF (Polyvinylidene Fluoride) or perfluoro (alkenylvinyl ethers). Contrary thereto, the first passivation layer 191 may include at least any one of materials of poly vinyl alcohol (PVA), benzocyclobutene (BCB), acryl-based resin, silicon polymer (Si-polymer) and the like. Continuously, a second passivation layer 193 including at least any one of ITO and IZO is formed on the first passivation layer 191 through a sputtering method. Here, the second passivation layer 193 is simultaneously patterned through a photolithography process.

Figure 4A:
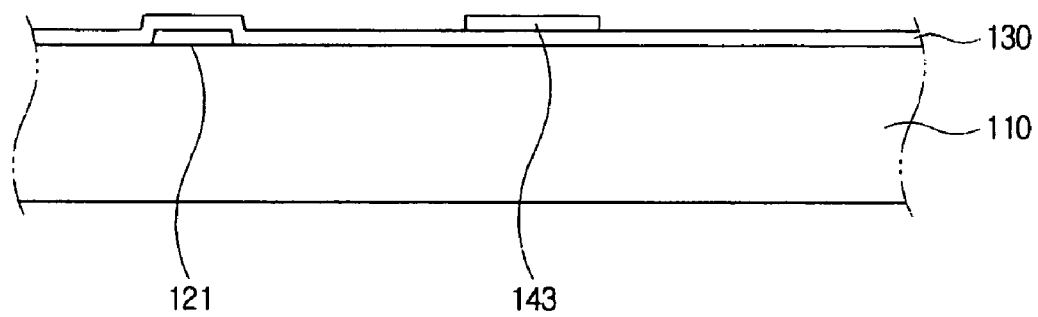
FIGS. 4A to 4G show views illustrating a manufacturing method of a display device according to a second embodiment of the present invention.
Figure 4B:
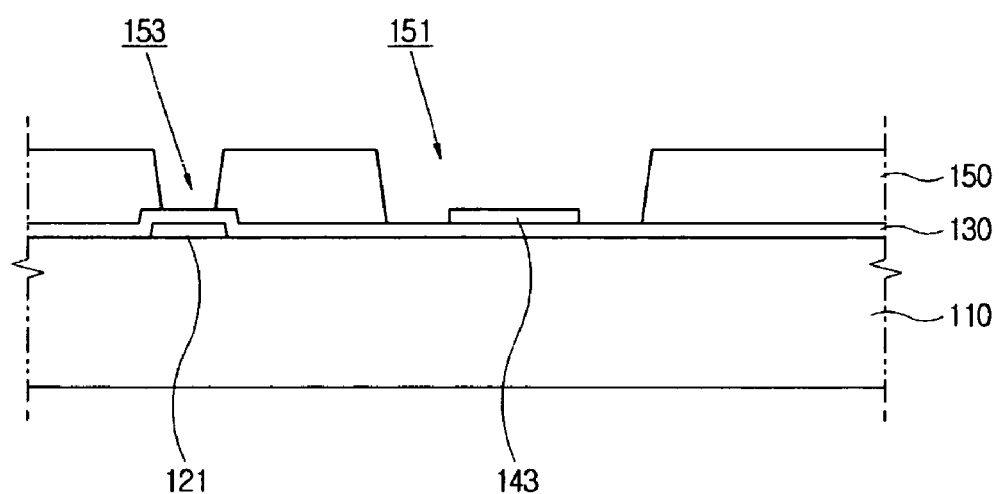

A manufacturing method of a flat display device according to a second embodiment of the present invention will be described below with reference to FIGS. 4A to 4k. In the second embodiment, only specific portions distinguished from the first embodiment will be extracted and explained, and the remainder will be based on the first embodiment or known technology. Further, like reference numerals will be used to indicate like elements, for convenience of illustration. First, data wires including a data line 121 and a layer insulating film 130 covering the data wires are formed on an insulating substrate 110 as shown in FIG. 4A. Here, contrary to the first embodiment, an insulating film contact hole for exposing a portion of the data line 121 is not formed on the interlayer insulating film 130. Further, gate wires including a gate electrode 143 are formed on the interlayer insulating film 130. Subsequently, a second barrier wall 150 is formed to have a second opening 151 for exposing the gate electrode 143 and a barrier wall contact hole 153 for connecting a source electrode 171 (referring to 4G) to be described later and the data line 121 as shown in FIG. 4B.

Figure 4C:
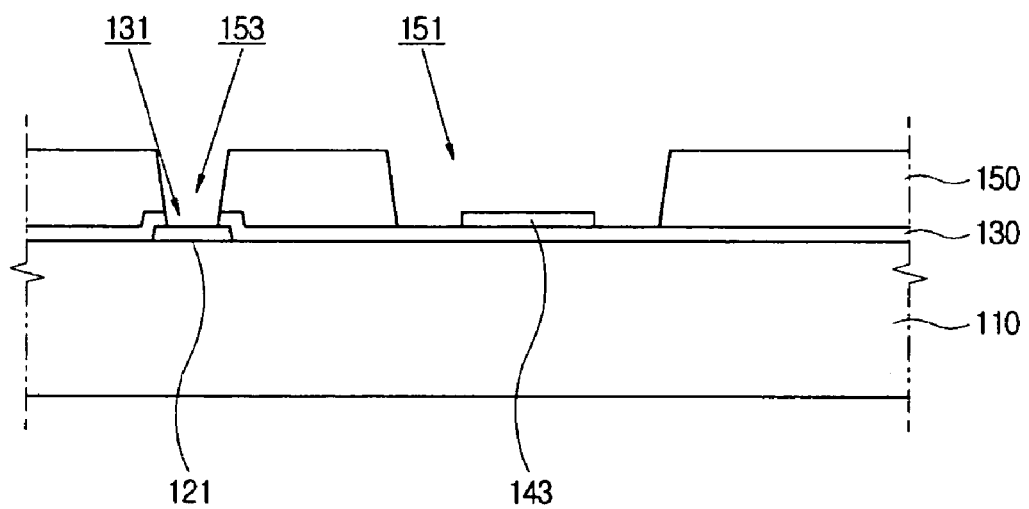
Figure 4D:
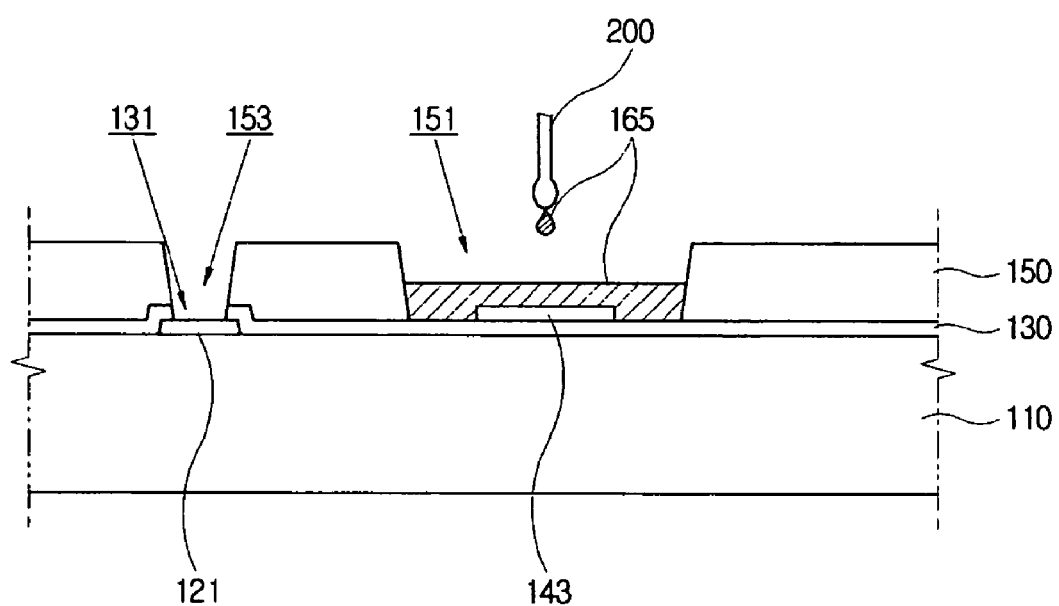

Next, a portion of the data line 121 is exposed through an etching process, and an insulating film contact hole 131 is then formed to correspond to the barrier wall contact hole 153 as shown in FIG. 4C. Although, in the first embodiment, the insulating film contact hole 131 is formed immediately after the interlayer insulating film 130 has been formed, the insulating film contact hole 131 of the second embodiment is formed after the second barrier wall 150 has been formed. Thereafter, a gate insulating film 160 is formed by jetting a gate insulating material 165 into the second opening 151 using a nozzle 200 that as shown in FIG. 4D.

Figure 4E:
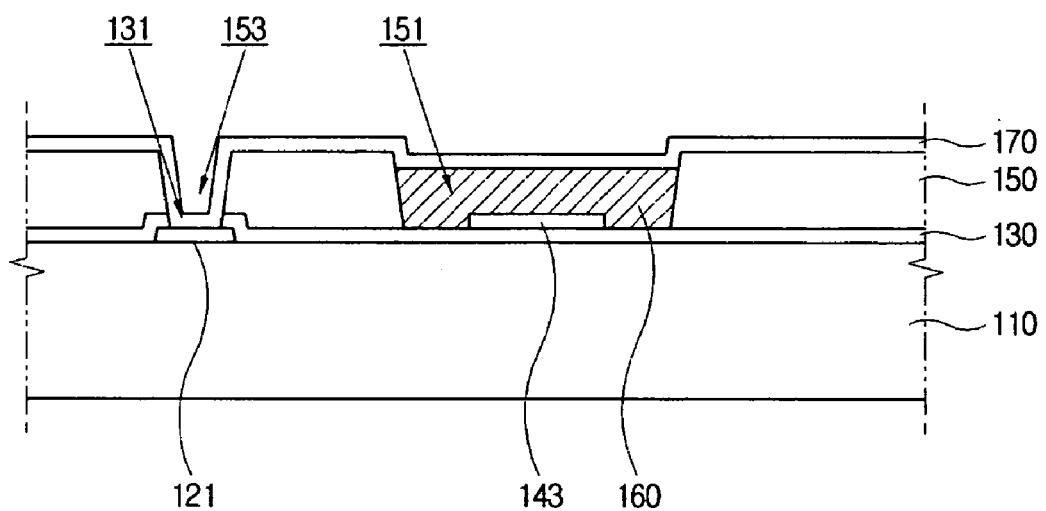
Figure 4F:
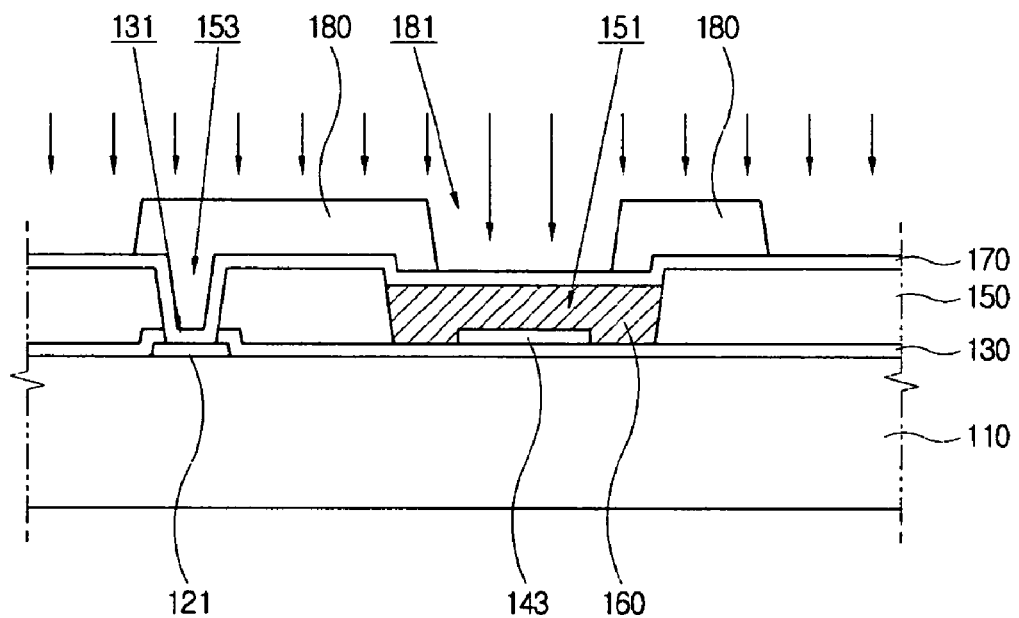

Subsequently, an electrode material layer 170 is formed by applying an electrode material on the insulating film 160 and the second barrier wall 150 as shown in FIG. 4E. The electrode material layer 170 has no open region and is connected to the data line 121 through the barrier wall contact hole 153 and the insulating film contact hole 131. Next, a first barrier wall 180 is formed to have a first opening 181 for exposing the electrode material layer 170 of a region corresponding to the gate electrode 143 as shown in FIG. 4F. Further, the surface of the first barrier wall 180 is treated.

According to the second embodiment, because the gate insulating film 160 is covered by the electrode material layer 170, plasma, a chemical substance or the like used in the surface treatment can not flow into the gate insulating film 160. Therefore, a property of the gate insulating film 160 is not changed, and an organic semiconductor solution is uniformly spread on the channel region 'C' so that a characteristic of an O-TFT is enhanced.

Figure 4G:
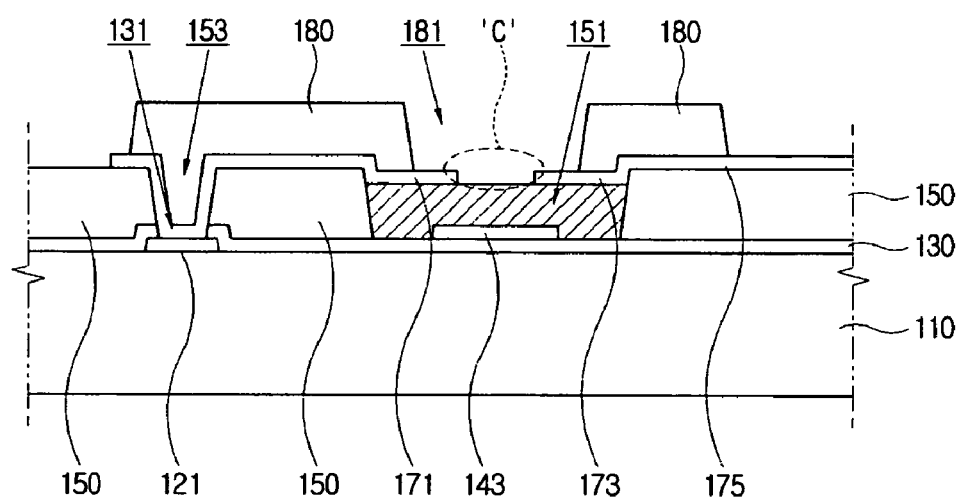

Thereafter, a source electrode 171, a drain electrode 173, a pixel electrode 175, a data pad contact member (not shown) and a gate pad contact member (not shown) are formed by patterning the electrode material layer 170 as shown in FIG. 4G. The formation of the electrode layers 171, 173, 175, 177 and 179 comprises the operations of: forming a photosensitive film on the first barrier wall 180 and the electrode material layer 170; positioning and light-exposing a mask with an aperture of a predetermined pattern on the photosensitive film; developing the photosensitive film such that only the photosensitive film corresponding to a region to be formed as the electrode layers 171, 173, 175, 177 and 179 is left; etching the electrode material layer 170 using the photosensitive film; and removing the residual photosensitive film.

Further, although not shown in this figure, a display device provided with an O-TFT in which its electrical characteristic is enhanced by forming an organic semiconductor layer, and first and second passivation films like the first embodiment is manufactured. As described above, according to one or more embodiments of the present invention, there is provided a manufacturing method of a display device wherein characteristics of a TFT can be enhanced.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of manufacturing a display device, comprising:
    forming a plurality of gate wires comprising a gate electrode on an insulating substrate;
    forming a gate insulating film on the gate electrode;
    forming an electrode material layer on the gate insulating film;
    forming a first barrier wall on the electrode material layer, the first barrier wall having a first opening for exposing at least a portion of the electrode material layer;
    treating a surface of the first barrier wall to make it hydrophobic;
    after the treating, forming an electrode layer comprising a source electrode and a drain electrode that are spaced apart from each other on the gate electrode by patterning the electrode material layer so as to expose a portion of the gate insulating film;
    and forming an organic semiconductor layer inside the first opening.

2. The method according to claim 1, wherein the electrode material layer comprises a transparent conductive material.

3. The method according to claim 2, wherein forming the electrode layer comprises:
    forming a photosensitive film on the first barrier wall and the electrode material layer;
    positioning a mask with an aperture of a predetermined pattern on the photosensitive film; light-exposing a portion of the photosensitive film through the mask aperture;
    developing the photosensitive film such that only the photosensitive film corresponding to a region to be formed as the electrode layer remains;
    etching the electrode material layer using the photosensitive film; and
    removing the photosensitive film.

4. The method according to claim 2, further comprising:
    forming a plurality of data wires which are insulated from and which cross the gate wires to define a pixel between the insulating substrate and the gate wires; and
    forming an interlayer insulating film to cover the data wires.

5. The method according to claim 4, wherein the forming of the gate insulating film comprises:
    forming a second barrier wall with a second opening for exposing the gate electrode on the interlayer insulating film; and
    forming the gate insulating film inside the second opening through an ink jet method.

6. The method according to claim 5, wherein the plurality of data wires include a data line, the method further comprising:
    forming simultaneously a barrier wall contact hole for exposing a portion of the interlayer insulating film together with the second opening on the second barrier wall; and
    forming an insulating film contact hole on the interlayer insulating film to expose a portion of the data line that corresponds to the barrier wall contact hole.

7. The method according to claim 6, further comprising:
    forming an insulating film contact hole for exposing a portion of the data line on the interlayer insulating film after the interlayer insulating film has been formed; and
    forming simultaneously a barrier wall contact hole corresponding to the insulating film contact hole together with the second opening on the second barrier wall.

* * * * *